(12) United States Patent  
Kwak

(10) Patent No.: US 6,927,150 B2  
(45) Date of Patent: Aug. 9, 2005

(54) METHOD OF MANUFACTURING A SEMICONDUCTOR DEVICE

(75) Inventor: Noh Yeal Kwak, Kyungki-Do (KR)

(73) Assignee: Hynix Semiconductor Inc., Kyungki-do (KR)

(*) Notice: Subject to any disclaimer, the term of this patent is extended or adjusted under 35 U.S.C. 154(b) by 0 days.

(21) Appl. No.: 10/618,290

(22) Filed: Jul. 11, 2003

(65) Prior Publication Data

US 2004/0106272 A1 Jun. 3, 2004

(30) Foreign Application Priority Data

Dec. 3, 2002 (KR) ................................ 10-2002-0076287

(51) Int. Cl.$^7$ ............................................... H01L 21/04
(52) U.S. Cl. .................... 438/510; 438/475; 438/514
(58) Field of Search ............................... 438/906, 920, 438/476, 510, 514, 522, 530, 477, 471, 475

(56) References Cited

U.S. PATENT DOCUMENTS

| | | | | |
|---|---|---|---|---|
| 6,087,247 A | * | 7/2000 | Downey | ..................... 438/530 |
| 2002/0052124 A1 | * | 5/2002 | Raaijmakers et al. | ........ 438/778 |
| 2002/0127766 A1 | * | 9/2002 | Ries et al. | ..................... 438/94 |
| 2003/0094435 A1 | * | 5/2003 | Drobny et al. | ................. 216/55 |

* cited by examiner

*Primary Examiner*—Caridad Everhart  
(74) *Attorney, Agent, or Firm*—Marshall, Gerstein & Borun LLP

(57) ABSTRACT

Disclosed is a method of manufacturing a semiconductor device. In ion implantation process for controlling the threshold voltage of the transistor or the semiconductor device such as a flash memory cell, the dose of the impurity capable of securing the uniformity is implanted by minimum. The retained dose of the impurity is controlled by out gassing the implanted impurity by means of a cleaning process. Therefore, a uniform distribution characteristic of the implanted impurity could be obtained. A transistor or a flash memory cell of a low operating voltage could be manufactured.

8 Claims, 3 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device, and more particularly, to a method of manufacturing a semiconductor device capable of securing a low operation voltage of the device by improving the uniformity of an ion implantation layer for controlling the threshold voltage of transistors or memory devices.

2. Background of the Related Art

In order to manufacture the semiconductor devices, an ion implantation process as well as deposition and etch processes must be inevitably implemented.

Of them, a method of manufacturing a flash memory device will be now described in short. A well and an ion implantation layer for controlling the threshold voltage are first sequentially formed in the active region by means of the ion implantation process. A stack structure of a tunnel oxide film and a first polysilicon layer is formed in a pattern vertical to the word line direction. A dielectric film and a second polysilicon layer are then sequentially formed. Next, the second polysilicon layer and the dielectric film are patterned to form a control gate. The first polysilicon layer is then patterned to form a floating gate. Thus, the flash memory device is completed.

In the above, an isolation film is formed, by forming a trench while patterning the first polysilicon layer and the tunnel oxide film through a patterning process and then burying an insulating material, in a state that the tunnel oxide film and the first polysilicon layer are formed and a pad nitride film is formed on the first polysilicon layer. If the isolation film is thus formed by applying a SA-STI (self aligned-shallow trench isolation) structure, it is possible to minimize damage of the tunnel oxide film and the tunnel oxide film from being formed too thinly.

Meanwhile, in case where a high voltage NMOS transistor to be used as a transistor for a X decoder and a cell transistor are manufactured by the above process in a NAND type flash device, a high voltage is applied to a p-well region and a junction region. For this reason, the source/drain junction region is not formed using a common plus junction but formed using a DDD (double doped drain) junction process and a plug ion implantation process. In this DDD junction, however, it is required that the dose of implanted impurity be reduced in order to improve a breakdown voltage characteristic for application of the high voltage. Due to this, not only the operating voltage of below 1.0V required in the transistor is increased but also it is difficult to secure the operating voltage of below 1.0V even with the dose of the impurity implanted in order to control the threshold voltage of the channel region. Also, although the ion implantation layer for controlling the threshold voltage is usually formed using the medium current ion implanter, it is more difficult to secure the operating voltage of below 1.0V in controlling the threshold voltage through the minimum ion implantation necessary for securing uniform ion implantation distribution.

SUMMARY OF THE INVENTION

Accordingly, the present invention is contrived to substantially obviate one or more problems due to limitations and disadvantages of the related art, and an object of the present invention is to provide a method of manufacturing a semiconductor device capable of manufacturing a transistors or flash memory cells of a low operation voltage whole securing uniform distribution characteristics of an implanted impurity, in such a manner that an impurity of the minimum dose capable of securing the uniformity is implanted and the implanted impurity is then out diffused by a cleaning process to control the retained dose of the impurity, in an ion implantation process for controlling the threshold voltage of the semiconductor devices such as the transistors or the flash memory cells.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of manufacturing a semiconductor device according to an embodiment of the present invention is characterized in that it comprises the steps of providing a semiconductor substrate for a given process is implemented in order to form a semiconductor device, forming an ion implantation layer by means of an ion implantation process, and controlling the impurity concentration of the ion implantation layer by means of a cleaning process.

In the above, the ion implantation layer may be formed by implanting an impurity of 1E11~1E13 ion/cm$^2$ with energy of 5~50 keV. At this time, boron may be implanted as the impurity and the impurity may be implanted at an angle of 3~13°.

Meanwhile, the cleaning process is implemented using a solution of fluoric acid series and the concentration of the impurity is reduced by out gassing the impurity. At this time, the solution of a fluoric acid series may employ diluted HF in which $H_2O$:HF is mixed in the ratio of 1:1~50:1 as an undiluted solution. This cleaning process may control the concentration of the remaining impurity by controlling the concentration of the solution or the progress time. In the cleaning process, a SC-1($NH_4OH/H_2O_2/H_2O$) solution may be added together to remove a native oxide film on the surface of the semiconductor substrate, so that out gassing of the impurity is activated.

The method may further comprise the steps of after the concentration of the impurity is controlled, sequentially forming a tunnel oxide film and a first polysilicon layer over a semiconductor substrate and then implementing patterning, forming an isolation film in an isolation region of the semiconductor substrate, sequentially forming a dielectric film, a second polysilicon layer and a silicide layer on the entire structure of the semiconductor substrate, sequentially patterning the silicide layer, the second polysilicon layer and the dielectric film by means of an etch process using a control gate mask, patterning the first polysilicon layer by means of a self-aligned etch process, and forming source/drain in the semiconductor substrate around the first polysilicon layer. At this time, the source/drain may have a DDD junction structure.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1A:
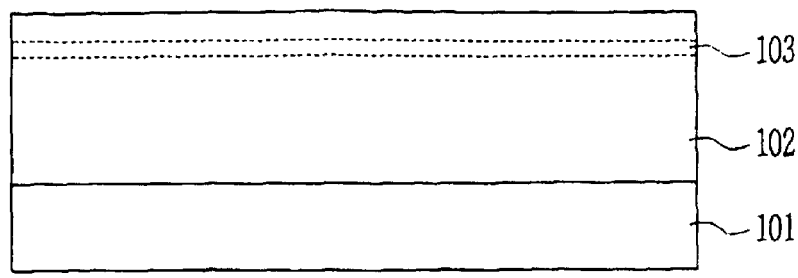
FIG. 1A~FIG. 1F are cross-sectional views of semiconductor devices for explaining a method of manufacturing the device according to an embodiment of the present invention.

Reference will now be made in detail to the preferred embodiments of the present invention, examples of which are illustrated in the accompanying drawings, in which like reference numerals are used to identify the same or similar parts.

FIG. 1A~FIG. 1F are cross-sectional views of semiconductor devices for explaining a method of manufacturing the device according to an embodiment of the present invention.

Referring to FIG. 1A, a well 102 is formed in a semiconductor substrate 101 by means of an ion implantation process. An ion implantation layer 103 is then formed at a given depth of the well 102 by means of an ion implantation process in order to control the threshold voltage of a transistor or a semiconductor device such as a flash memory cell. At this time, the well 102 may be formed to have a triple well structure or a single well structure depending on the operating voltage of the semiconductor device to be formed in a subsequent process. Furthermore, ion implantation may not be implemented for a region where a high voltage NMOS transistor will be formed and a p type substrate itself may be used along with the well.

Meanwhile, the ion implantation layer 103 for controlling the threshold voltage may be formed by implanting an impurity of 1E11~1E13 ion/cm$^2$ with energy of 5~50 keV. At this time, the impurity may include boron and may be implanted at an angle of 3~13° in order to prevent generation of channeling due to implantation of the impurity.

Figure 1B:
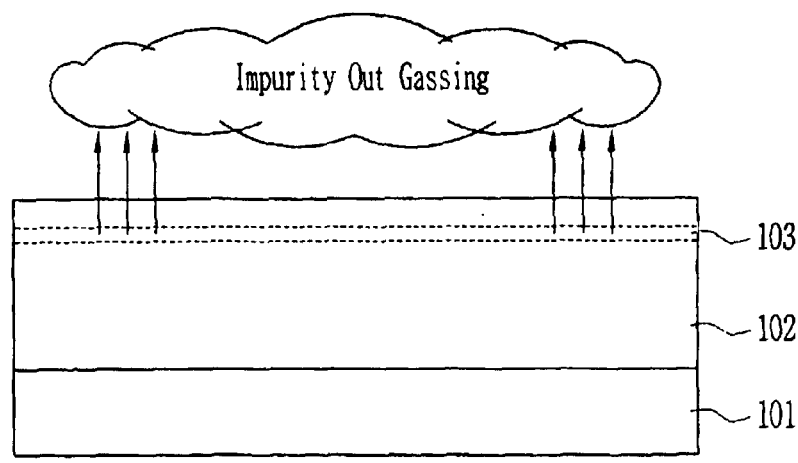

Turning to FIG. 1B, in order to control the threshold voltage of a transistor or a flash memory cell to be formed in a subsequent process, the impurity concentration of the ion implantation layer 103 is reduced. At this time, the impurity concentration of the ion implantation layer 103 may be reduced by out gassing boron through a cleaning process. The cleaning process may employ a fluoric acid (HF) series solution as an undiluted solution or hydrofluoric acid where H$_2$O:HF is mixed in the ratio of 1:1~50:1 as the undiluted solution. This cleaning process may control the concentration of the remaining impurity by adjusting the concentration of the solution and the progress time. Out gassing of boron may be activated by adding a SC-1 (NH$_4$OH/H$_2$O$_2$/H$_2$O) solution to remove a native oxide film on the surface of the substrate 101.

Figure 2:
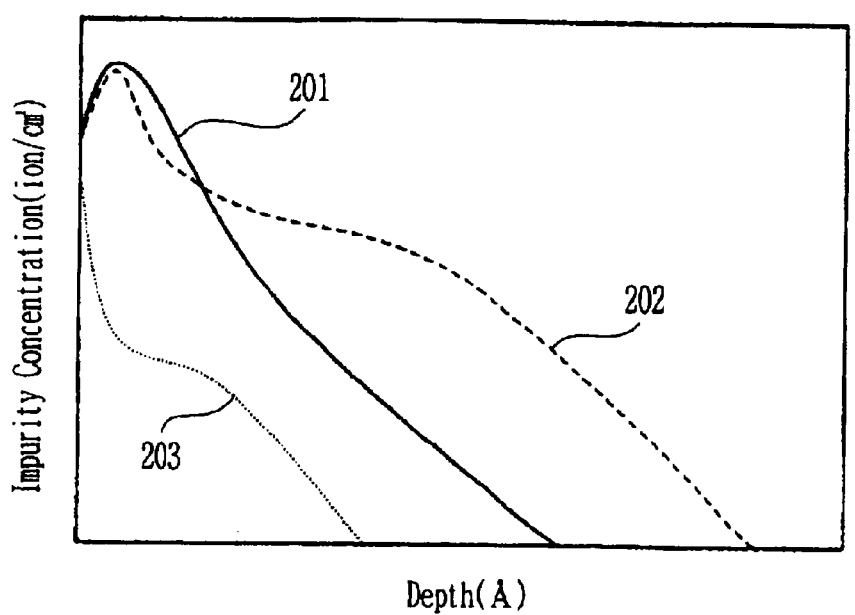
FIG. 2 is a characteristic graph illustrating distribution characteristic of an impurity depending on the depth after the concentration of the impurity is adjusted in FIG. 1B.

Distribution characteristics of the impurity when the impurity concentration of the ion implantation layer 103 for controlling the threshold voltage is reduced by the cleaning process is as follows. FIG. 2 is a characteristic graph illustrating distribution characteristic of an impurity depending on the depth after the concentration of the impurity is adjusted in FIG. 1B.

Turning to FIG. 2, distribution characteristics of the impurity such as a first curve 201 is normally obtained after the impurity implantation process is implemented. In case where a raid thermal process is implemented in order to activate the impurity, distribution characteristics of the impurity such as a second curve 202 is obtained. Meanwhile, as in the above, in case where the impurity concentration of the ion implantation layer 103 is controlled by the cleaning process, distribution characteristics of the impurity such as a third curve 202 is obtained. After comparing the second curve 202 and the third curve 203, it could be seen that the case where the concentration of the impurity is lowered by the cleaning process and the case where the rapid thermal process is implemented have a similar pattern in the distribution characteristics except for the concentration of the impurity. It is possible to lower the operating voltage of the device below 1.0V, by lowering only the concentration of the impurity while securing a uniform distribution characteristic with the same distribution pattern.

Next, a transistor or a flash memory cell may be formed in the semiconductor substrate 101 in which the well 102 is formed. The process of forming the flash memory cell will be now described.

Figure 1C:
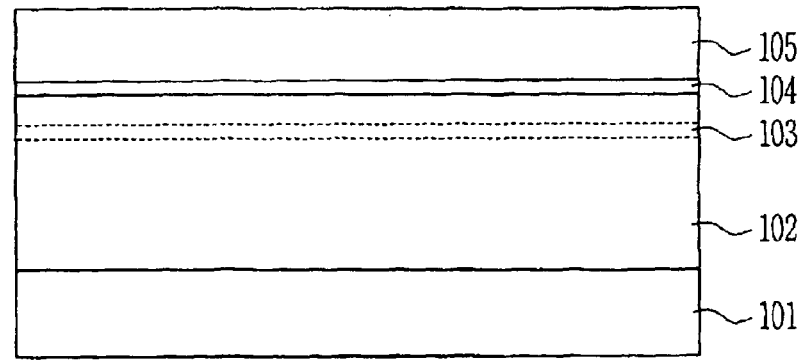

Referring to FIG. 1C, a tunnel oxide film 104 and a first polysilicon layer 105 for forming a floating gate are sequentially formed over the semiconductor substrate 101. At this time, the tunnel oxide film 104 is formed by a wet oxidization process at a temperature of 750~800° C. and is then annealed under nitrogen atmosphere at a temperature of 900~910° C. for 20~30 minutes, so that the interfacial defect density between the semiconductor substrate 101 and the tunnel oxide film 104 is minimized. Meanwhile, the first polysilicon layer 105 is formed using a doped polysilicon layer the grain size of which is minimized, by means of a LP-CVD (low pressure chemical vapor deposition) method using SiH$_4$ or Si$_2$H$_6$ and PH$_3$ gas at a temperature of 580~620° C. under a low pressure of 0.1~3 Torr. At this time, the concentration of the impurity (P) in the doped polysilicon layer is controlled to a level of 1.5E20~3.0E20 atoms/cc and is formed in thickness of 250~500 Å.

Figure 1D:
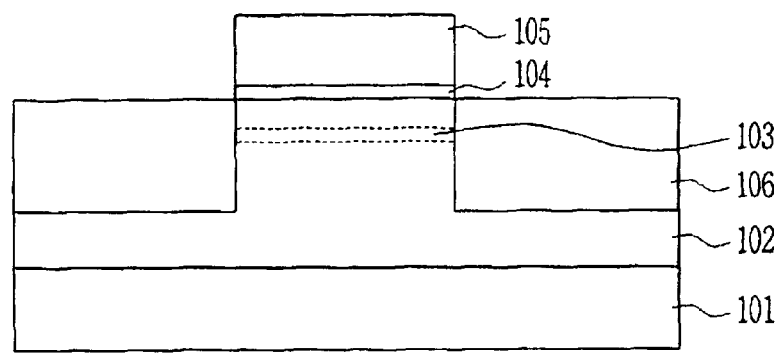

By reference to FIG. 1D, a pad nitride film (not shown) in which an isolation region is defined is formed on the first polysilicon layer 105. The first polysilicon layer 105 and the tunnel oxide film 104 are then sequentially patterned. At this time, the pad nitride film may be formed in thickness of 900~2000 Å by means of the LP-CVD method. Thereafter, the substrate 101 in the isolation region is etched to form a trench. An insulating material is then buried to form an isolation film 106 of a STI (shallow trench isolation) structure.

Figure 1E:
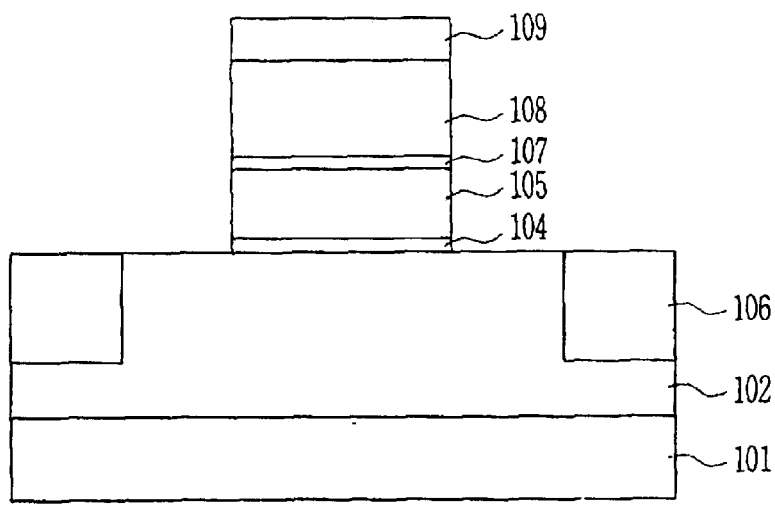

Turning to FIG. 1E, after the pad nitride film is removed, a dielectric film 107, a second polysilicon layer 108 for forming a control gate and a silicide layer 109 are sequentially formed. At this time, before the dielectric film 107 is formed, a polysilicon layer may be additionally formed on the first polysilicon layer 105 in order to increase the coupling ratio of the floating gate. Next, the silicide layer 109, the second polysilicon layer 108 and the dielectric film 107 are sequentially patterned by means of an etch process using the control gate as a mask. The first polysilicon layer 105 is then patterned by a self-aligned etch process.

In the above, the polysilicon layer that is additionally formed on the first polysilicon layer 105 may be formed in thickness of 400~1000 Å. Meanwhile, the dielectric film 107 may have an ONO structure in which $SiO_2/Si_3N_4/SiO_2$ are sequentially stacked. At this time, the $SiO_2$ film is formed, by forming a HTO (hot temperature oxide) film formed using DCS ($SiH_2Cl_2$) and $N_2O$ gas having good voltage-resistant characteristic and TDDB (time dependent dielectric breakdown) characteristic as a source gas in thickness of 35~60 Å, loading the semiconductor substrate onto the chamber at a loading temperature of 600~700° C. and then implementing the LP-CVD method at a temperature of 810~850° C. under a low pressure of 0.1~3 Torr. Meanwhile, the $Si_3N_4$ film is formed in thickness of 50~65 Å and is formed by means of the LP-CVD method using $NH_3$ and DCS gas at a temperature of 650~800° C. under a pressure of 1~3 Torr.

Figure 1F:
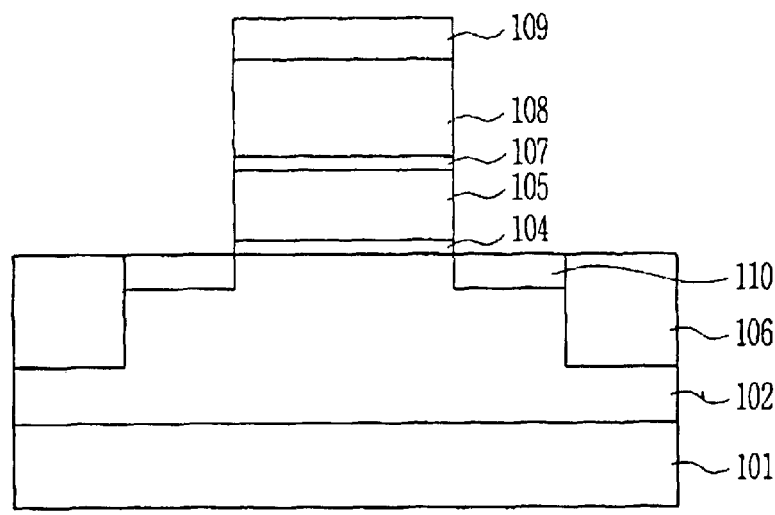

By reference to FIG. 1F, source/drain 110 is formed in the substrate 101 around the first polysilicon layer 105. At this time, the source/drain 110 may be formed to have a DDD (double doped drain) junction structure in order to increase the breakdown voltage against the high voltage. In case where the source/drain 110 is formed to have the DDD junction structure in order to manufacture the high voltage semiconductor devices, doping of a positive type that is further low is required within the channel junction of the semiconductor device that operates with the common voltage.

Thereby, a flash memory cell having a low operating voltage is manufactured.

The process of controlling the impurity concentration of the ion implantation layer for controlling the threshold voltage is not limited to the ion implantation layer for controlling the threshold voltage but could be applied to all processes implemented to control the concentration of the impurity after the ion implantation process is implemented.

As described above, the present invention can have the following new effects through the mentioned method.

First, the concentration of the ion implantation layer for controlling the threshold voltage is lowered by means of the cleaning process. Therefore, the ion implantation layer could be formed with the minimum dose of implantation while keeping a good distribution characteristic.

Second, conventionally, it was impossible to prohibit a TED (transient enhanced diffusion) phenomenon of an impurity implanted in order to control the threshold voltage. Furthermore, it was difficult to prevent degradation in the film quality of the tunnel oxide film or the gate oxide film due to out gassing of F when $BF_2$ is implanted in order to form a shallow channel within a channel junction. In the contrast, the present invention could prevent the TED phenomenon or degradation of the film quality of the oxide film by only implanting boron by surface focus out gassing.

Third, it is possible to prevent in advance degradation in the film quality of the oxide film by a hall effect of a NAND flash device using a FN tunneling due to Vt adjust profile for controlling a steep threshold voltage within the effective channel length. It is thus possible to secure an outstanding date retention characteristic.

Fourth, the retained dose of the impurity for controlling the threshold voltage is increased. It could be flexibly applied to an oxide film such as a NO gate as well as pure thermal oxide.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of manufacturing a semiconductor device, comprising the steps of:
   providing a semiconductor substrate on which a given process is implemented in order to form a semiconductor device;
   forming an ion implantation layer in a well by means of an ion implantation process; and
   controlling the impurity concentration of the ion implantation layer by means of a cleaning process, wherein the cleaning process is implemented using a solution of fluoric acid series and a SC-1($NH_4OH/H_2O/H_2O$) solution to remove a native oxide film on the surface of the semiconductor substrate.

2. The method as claimed in claim 1, wherein the solution of a fluoric acid series employs diluted HF in which $H_2O$:HF is mixed in the ratio of 1:1~50:1 as an undiluted solution.

3. The method as claimed in claim 1, wherein the cleaning process controls the concentration of the remaining impurity by controlling the concentration of the solution or the progress time.

4. The method as claimed in claim 1, wherein the ion implantation layer is formed by implanting an impurity of 1E11~1E13 ion/$cm^2$ with an energy of 5~50 keV.

5. The method as claimed in claim 4, wherein the impurity is boron.

6. The method as claimed in claim 4, wherein the impurity is implanted at an angle of 3~13°.

7. A method of manufacturing a semiconductor device, comprising:
   providing a semiconductor substrate on which a given process is implemented in order to form a semiconductor device;
   forming an ion implantation layer by means of an ion implantation process; and
   controlling the impurity concentration of the ion implantation layer by means of a cleaning process, wherein the cleaning process is implemented using a solution of fluoric acid series and a SC-1($NH_4OH/H_2O/H_2O$) solution to remove a native oxide film on the surface of the semiconductor substrate;
   sequentially forming a tunnel oxide film and a first polysilicon layer over a semiconductor substrate and then implementing patterning;
   forming an isolation film in an isolation region of the semiconductor substrate;
   sequentially forming a dielectric film, a second polysilicon layer and a silicide layer on the entire structure of the semiconductor substrate;
   sequentially patterning the silicide layer, the second polysilicon layer and the dielectric film by means of an etch process using a control gate mask;
   patterning the first polysilicon layer by means of a self-aligned etch process; and
   forming source/drain in the semiconductor substrate around the first polysilicon layer.

8. The method as claimed in claim 7, wherein the source/drain has a DDD junction structure.

* * * * *